US008952242B2

(12) United States Patent
Raffaele et al.

(10) Patent No.: US 8,952,242 B2
(45) Date of Patent: Feb. 10, 2015

(54) NANOSTRUCTURED QUANTUM DOTS OR DASHES IN PHOTOVOLTAIC DEVICES AND METHODS THEREOF

(75) Inventors: Ryne P. Raffaele, Honeoye Falls, NY (US); David M. Wilt, Bay Village, OH (US)

(73) Assignees: Rochester Institute of Technology, Rochester, NY (US); The United States of America as represented by the National Aeronautics and Space Administration, Washington, DC (US)

( * ) Notice: Subject to any disclaimer, the term of this patent is extended or adjusted under 35 U.S.C. 154(b) by 84 days.

(21) Appl. No.: 12/630,334

(22) Filed: Dec. 3, 2009

(65) Prior Publication Data

US 2010/0081228 A1   Apr. 1, 2010

Related U.S. Application Data

(62) Division of application No. 11/744,010, filed on May 3, 2007.

(60) Provisional application No. 60/797,151, filed on May 3, 2006.

(51) Int. Cl.
*H01L 31/05* (2014.01)
*H01L 31/075* (2012.01)
(Continued)

(52) U.S. Cl.
CPC ..... *H01L 27/1423* (2013.01); *H01L 31/035263* (2013.01); *H01L 31/035236* (2013.01); *H01L 31/0352* (2013.01); *Y02E 10/50* (2013.01); *B82Y 20/00* (2013.01)

USPC ............... 136/255; 136/249; 438/81; 438/66

(58) Field of Classification Search
USPC ............................ 136/252–265, 249; 438/57
See application file for complete search history.

(56) References Cited

U.S. PATENT DOCUMENTS 3,994,012 A * 11/1976 Warner, Jr. .................. 136/246
4,178,521 A   12/1979 Speth
(Continued)

FOREIGN PATENT DOCUMENTS

DE   3728524 A1   3/1988
EP   0 165 419 B1   12/1985
(Continued)

OTHER PUBLICATIONS

Raffaelle et al., Quantum Dot Solar Cells, Progress in Photovoltaics: Research and Applications, vol. 10, pp. 433-439, 2002.*
(Continued)

*Primary Examiner* — Jayne Mershon
(74) *Attorney, Agent, or Firm* — Joseph M Noto; Bond Schoeneck & King PLLC

(57) ABSTRACT

A photovoltaic device includes one or more structures, an array of at least one of quantum dots and quantum dashes, at least one groove, and at least one conductor. Each of the structures comprises an intrinsic layer on one of an n type layer and a p type layer and the other one of the n type layer and the p type layer on the intrinsic layer. The array of at least one of quantum dots and quantum dashes is located in the intrinsic layer in at least one of the structures. The groove extends into at least one of the structures and the conductor is located along at least a portion of the groove.

6 Claims, 2 Drawing Sheets

(51) Int. Cl.
   *H01L 27/142* (2014.01)
   *B82Y 20/00* (2011.01)
   *H01L 31/0352* (2006.01)

(56) References Cited

U.S. PATENT DOCUMENTS

| | | | |
|---|---|---|---|
| 4,758,527 A * | 7/1988 | Yamazaki | 438/96 |
| 4,872,046 A | 10/1989 | Morkoc et al. | |
| 4,941,024 A | 7/1990 | Hayakawa et al. | |
| 4,948,436 A * | 8/1990 | Juergens | 136/249 |
| 4,974,036 A | 11/1990 | Kapon | |
| 5,065,200 A | 11/1991 | Bhat et al. | |
| 5,070,387 A | 12/1991 | Van Gorkum | |
| 5,260,621 A | 11/1993 | Little et al. | |
| 5,440,187 A | 8/1995 | Little et al. | |
| 5,527,716 A | 6/1996 | Kusian et al. | |
| 5,562,781 A | 10/1996 | Ingram et al. | |
| 5,590,162 A | 12/1996 | Terhune et al. | |
| 5,642,014 A | 6/1997 | Hillenius | |
| 5,714,765 A | 2/1998 | Noetzel et al. | |
| 5,720,826 A * | 2/1998 | Hayashi et al. | 136/249 |
| 5,859,484 A | 1/1999 | Mannik et al. | |
| 6,384,317 B1 | 5/2002 | Kerschaver et al. | |
| 6,410,843 B1 | 6/2002 | Kishi et al. | |
| 7,737,356 B2 | 6/2010 | Goldstein | |
| 2005/0150542 A1 | 7/2005 | Madan | |
| 2005/0155641 A1* | 7/2005 | Fafard | 136/249 |
| 2007/0023082 A1 | 2/2007 | Manivannan et al. | |
| 2008/0029147 A1* | 2/2008 | Yang et al. | 136/244 |

FOREIGN PATENT DOCUMENTS

| | | |
|---|---|---|
| EP | 0 244 140 A2 | 11/1987 |
| GB | 2195050 A | 3/1988 |
| JP | 2139970 A | 5/1990 |

OTHER PUBLICATIONS

Fafard et al., Manipulating the Energy Levels of Semiconductor quantum Dots, Physical Review, vol. 59, No. 23, pp. 1-6, 1999.*

Williams et al., "Irreversibilities in the Mechanism of Photoelectrolysis," Nature Journal, (1978), vol. 271:137-139.

Martí et al., "Quantum Dot Intermediate Band Solar Cell" In Twenty-eighth IEEE Proceedings of the Photovoltaics Specialists Conference, Anchorage, Alaska, Sep. 2000, pp. 940-943.

Shockley et al., "Detailed Balance Limit of Efficiency of p-n Junction Solar Cells," Journal of Applied Physics, Mar. 1961, vol. 32, No. 3, pp. 510-519.

Brown et al., "Limiting efficiency for a multi-band solar cell containing three and four bands," Physica E, (2002), vol. 14:121-125.

Walters et al., "Radiation Hard Multi-Quantum Well InP/InAsP Solar Cells for Space Applications," Progress Photovoltaics: Research and Applications, (2000), vol. 8:349-354.

Sobolev et al., "Enhanced Radiation Hardness of InAs/GaAs Quantum Dot Structures," D. Phys. Stat. Sol. (b), (2001), vol. 224(1):93-96.

Griffin et al., "The application of quantum well solar cells to thermophotovoltaics," Solar Energy Materials and Solar Cells, (1998), vol. 50:213-219.

Kamprachum et al., "Multi-Stacked Quantum Dots With Graded Dot Sizes for Photovoltaic Applications," 2002 IEEE Proceedings of the Photovoltaics Specialists Conference, New Orleans, LA, May 20-24, 2002, pp. 1055-1057.

Petroff et al., "MBE and MOCVD Growth and Properties of Self-Assembling Quantum Dot Arrays in III-V Semiconductor Structures," Superlattice and Microstructures, (1994), vol. 15(1):15-21.

Kiravittaya et al., "Self-Assembled Composite Quantum Dots for Photovoltaic Applications," 28th IEEE Photovoltaics Specialists Conference, (2000), pp. 818-821, Anchorage, AK.

Kiravittaya et al., "AlGaAs/GaAs/InGaAs composite MQW structures for photovoltaic applications," Solar Energy Materials and Solar Cells, (2001), vol. 68:89-95.

Luque et al., "General equivalent circuit for Intermediate band devices: Potentials, currents and electroluminescence," Journal of Applied Physics, Jul. 2004, vol. 96(1):903-909.

Ekins-Daukes et al., "Minimum Performance Criteria for Quantum Well Based Junction in Multi-Junction Solar Cells", 31st IEEE Photovolt. Specialist Conf., (2005), pp. 86-89, Orlando, FL.

Raffaelle et al., "Quantum Dot Solar Cells" Progress in Photovoltaics: Research and Applications, (2002), vol. 10:433-439.

Aroutiounian et al., "Quantum Dot Solar Cells", proc. 13th workshop on Quantum Solar Energy Conversion—(Quantsol 2001), Mar. 11-17, 2001, pp. 38-45, Kirchberg in Tirol, Austria.

Raffaelle et al., "InAs Quantum Dot Development for Enhance InGaAs Space Solar Cells", Mater. Res. Soc. Symp. Proc. (2005), vol. 851:195-203.

Michael et al., "Application of the SILVACO/ATLAS Software Package in Modeling and Optimization of State-of-the-Art Photovoltaic Devices," 45th Midwest Symposium on Circuits and Systems, (2002), vol. 2:4-7, pp. II-651-II-654.

Marcinkevicius et al., "Changes in carrier dynamics induced by proton irradiation in quantum dots," Physica B, (2002), vol. 314:203-206.

Marti et al., "Present Status of the Metallic Intermediate Band Solar Cell Research," Jun. 7-11, 2004, Oral Presentation at the 19th European Photovoltaic solar Energy conference and Exhibition.

International Search Report for PCT/US 07/68167, May 22, 2008, 14 pages.

* cited by examiner

NANOSTRUCTURED QUANTUM DOTS OR DASHES IN PHOTOVOLTAIC DEVICES AND METHODS THEREOF

This application is a divisional of U.S. patent application Ser. No. 11/744,010, filed May 3, 2007, which claims the benefit of U.S. Provisional Patent Application Ser. No. 60/797,151, filed May 3, 2006, which are hereby incorporated by reference in their entirety.

This invention was made with Government support under Grant No. NAG3-2595, awarded by National Aeronautics and Space Administration, Glen Research Center. The U.S. Government has certain rights.

FIELD OF THE INVENTION

The present invention generally relates to photovoltaic devices and, more particularly, to nanostructured quantum dots or dashes in photovoltaic devices and methods thereof.

BACKGROUND

Basically, a photovoltaic device or solar cell has a large-area p-n junction diode which is capable of converting solar light into usable electrical energy. This conversion of solar light into electrical energy is known as the photovoltaic effect. Unfortunately, the efficiencies of these photovoltaic devices have been less than ideal.

To improve energy conversion efficiency, prior photovoltaic devices have attempted to use lattice-matched materials and also have tried to make adjustments to individual cell thickness. Although these efforts improved the performance of these prior photovoltaic devices, optimum results still have not been obtained.

Other attempts to improve energy conversion efficiency have focused on obtaining a more optimized set of bandgaps in the photovoltaic device by adjusting the compositions of the p-n junction diodes and by growing lattice mis-matched materials. However, again although these efforts improved the performance of these prior photovoltaic devices, the results have been less than optimal.

SUMMARY

A photovoltaic device in accordance with embodiments of the present invention includes one or more structures, an array of at least one of quantum dots and quantum dashes, at least one groove, and at least one conductor. Each of the structures comprises an intrinsic layer on one of an n type layer and a p type layer and the other one of the n type layer and the p type layer on the intrinsic layer. The array of at least one of quantum dots and quantum dashes is located in the intrinsic layer in at least one of the structures. The groove extends into at least one of the structures and the conductor is located along at least a portion of the groove.

A method for making a photovoltaic device in accordance with other embodiments of the present invention includes forming one or more structures where each of the structures has an intrinsic layer on one of an n type layer and a p type layer and forming the other one of the n type layer and the p type layer on the intrinsic layer. An array of at least one of quantum dots and quantum dashes are incorporated in the intrinsic layer in at least one of the structures. At least one groove is formed which extends into at least one of the structures and at least one conductor is provided along at least a portion of the groove.

A method for converting radiation into electrical energy in accordance with other embodiments of the present invention includes exposing one or more structures to radiation. Each of the structures comprises an intrinsic layer on one of an n type layer and a p type layer and the other one of the n type layer and the p type layer on the intrinsic layer and an array of at least one of quantum dots and quantum dashes in the intrinsic layer in at least one of the structures. Carriers are generated from the radiation absorbed by the structures. The generated carriers are laterally transporting along the other one of an n type layer and a p type layer, the intrinsic layer, and the one of the n type layer and the p type to at least one conductor along at least a portion of one groove which extends into at least one of the structures. The transported carriers are output as electrical energy with the conductor.

The present invention provides a more efficient and effective photovoltaic device for converting solar light and other radiation into usable electrical energy. The present invention takes advantage of the quantum confinement associated with quantum dots, while avoiding prior problems of absorption and transport. Additionally, the size of the quantum dots in the present invention can be used to tune the photovoltaic device for particular application. Further, the present invention is highly suitable for use in extreme environments, such as space.

DETAILED DESCRIPTION

Figure 1:
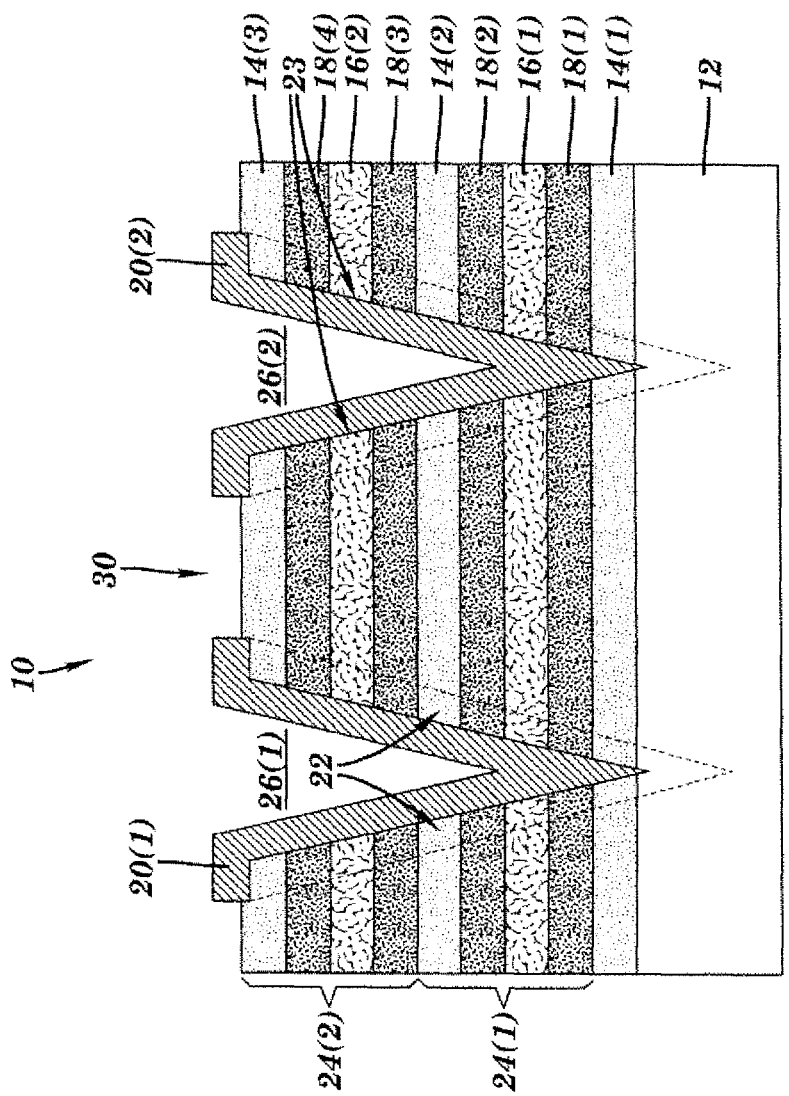
FIG. 1 is a cross sectional view of nanostructured quantum dots in a photovoltaic device in accordance with embodiments of the present invention.

A photovoltaic device 10 in accordance with embodiments of the present invention is illustrated in FIG. 1. The photovoltaic device 10 includes a substrate 12, n type layers 14(1)-14(3), p type layers 16(1)-16(2), intrinsic layers 18(1)-18(4), conductive contacts 20(1)-20(2), n type region 22, p type region 23, and grooves 26(2)-26(2), although the device 10 can include other types and numbers of layers, grooves, components, devices, and/or systems configured in other manners. The present invention provides a number of advantages including providing a more efficient and effective photovoltaic device for converting solar light into usable electrical energy.

Referring more specifically to FIG. 1, the photovoltaic device 10 includes an n type layer 14(1) on a substrate 12, a structure 24(1) on the n type layer 14(1), and a structure 24(2) on the structure 24(1), although the photovoltaic device 10 can comprise other numbers and types of layers and structures in other configurations. The substrate 12 is made of a semi-insulating material, such as silicon, although other types and numbers of semi-insulating or insulating materials could be used. The structure 24(1) comprises n type layer 14(2) on intrinsic layer 18(2) on p type layer 16(1) on intrinsic layer 18(1) and structure 24(2) comprises n type layer 14(3) on intrinsic layer 18(4) on p type layer 16(2) on intrinsic layer 18(3) to each form "nipi" structures 24(1) and 24(2), although other numbers of structures can be formed and each of the structures could comprise other types and numbers of layers in other configurations.

In the "nipi" structures 24(1) and 24(2), each of the p type layers 16(1)-16(2) is separated from the n type layers 14(1)-14(3) by one of the intrinsic layers 18(1)-18(4). The n type layers 14(1)-14(3) each comprise a layer of GaAs which has been doped to be n type, although each of these n type layers could comprise other numbers and types of layers made of other types of materials. The p type layers 16(1)-16(2) each comprise a layer of GaAs which has been doped to be p type, although each of these p type layers could comprise other numbers and types of layers made of other types of materials.

The intrinsic layers 18(1)-18(4) each comprise an undoped layer of InGaP, although each of these intrinsic layers could comprise other numbers and types of layers made of other types of materials. In this particular embodiment, InGaP was chosen as the host material because the bandgap of InGaP is controllable by controlling growth parameters. This bandgap can approach the 2.0 eV range in which dark current problems can be dramatically reduced yielding very favorable temperature coefficients and therefore suitability in extreme environments, such as space. Additionally, the wider bandgap is able to provide a larger photovoltage, without the penalty associated with conventional designs where the quantum dots are used as the primary absorbers. Further, InGaP has been shown to be one of the most radiation tolerant materials tested for extreme environments.

A plurality of quantum dots of substantially the same size are incorporated in each of the intrinsic layers 18(1)-18(4), although one or more of the intrinsic layers may have quantum dots or dashes and the dots or dashes may have other sizes. For example, the size of the quantum dots or dashes in each of the intrinsic layers may decrease with the depth of the grooves 26(1) and 26(2) from the surface 30 towards the substrate. Smaller quantum dots or dashes have wider bandgaps while larger quantum dots or dashes have narrower bandgaps. Accordingly, a size of the quantum dots or dashes in each of the intrinsic layers 18(1)-18(4) that decreased with the depth from surface 30 towards the substrate 12 would selectively filter incident photons in an analogous way to a multi-junction solar cell. The presence of quantum dots or dashes in the intrinsic layers 18(1)-18(4) in the structures 24(1) and 24(2) help to provide a conversion efficiency which is much greater than conventional solar cell. By way of example only, this conversion efficiency is improved by over 63% with the present invention.

Grooves 26(1)-26(2) are V-shaped and each extend into the structures 24(1) and 24(2), although other numbers and shapes of grooves could be formed. In this particular embodiment, grooves 26(1) and 26(2) each extend through n type layer 14(3), intrinsic layer 18(4), p type layer 16(2), intrinsic layer 18(3), n type layer 14(2), intrinsic layer 18(2), p type layer 16(1), intrinsic layer 18(1), and n type layer 14(1), although each of the grooves could extend through other numbers and types of layers to other depths.

An n type region 22 is formed adjacent the groove 26(1) in the n type layer 14(3), intrinsic layer 18(4), p type layer 16(2), intrinsic layer 18(3), n type layer 14(2), intrinsic layer 18(2), p type layer 16(1), intrinsic layer 18(1), n type layer 14(1), and substrate 12 and a p type region 22 is formed adjacent the groove 26(2) in the n type layer 14(3), intrinsic layer 18(4), p type layer 16(2), intrinsic layer 18(3), n type layer 14(2), intrinsic layer 18(2), p type layer 16(1), intrinsic layer 18(1), n type layer 14(1), and substrate 12, although other types and numbers of regions could be formed in other types and numbers of layers.

Conductive contact 20(1) is located in groove 26(1) in contact with the n type region 22 and conductive contact 20(2) is located in groove 26(2) in contact with p type region 23, although the conductive contacts 20(1) and 20(2) can extend along other portions of the grooves 26(1) and 26(2). The conductive contacts 20(1) and 20(2) are each made of alloys of gold and/or silver, although other types of conductive materials could be used.

A method of making a photovoltaic device 10 in accordance with embodiments of the present invention will now be described with reference to FIG. 1. A substrate 12 made of semi-insulating materials is provided, the n type layer 14(1) is deposited on a surface of the substrate 12, and then "nipi" structures 24(1) and 24(2) are sequentially formed on the n type layer 14(1), although other numbers and types of layers and structures can be formed on the substrate 12.

More specifically, in this particular embodiment: the n type layer 14(1) is deposited on substrate 12; the intrinsic layer 18(1) is deposited on the n type layer 14(1); the p type layer 16(1) is deposited on the intrinsic layer 18(1); the intrinsic layer 18(2) is deposited on the p type layer 16(1); the n type layer 14(2) is deposited on intrinsic layer 18(2); the intrinsic layer 18(3) is deposited on the n type layer 14(2); the p type layer 16(2) is deposited on the intrinsic layer 18(3); the intrinsic layer 18(4) is deposited on the p type layer 16(2); and the n type layer 14(3) is deposited on the intrinsic layer 18(4), although other numbers and types of layers can be formed on the substrate 12. The n type layers 14(1)-14(3), p type layers 16(1)-16(2), and the intrinsic layers 18(1)-18(4) are produced using an epitaxial crystal growth process, such as metal organic chemical vapor deposition (MOCVD), although other manners for producing these layers can be used, such as organometallic vapor deposition (OMVPE) and molecular beam epitaxy (MBE) by way of example only. The particular number, doping, thickness, and size of the these layers and of the quantum dots or dashes depends on the anticipated illumination spectra and thermal and radiation environments for the photovoltaic device 10.

The quantum dots or dashes are introduced into the intrinsic layers 18(1)-18(4) during the growth of the materials which make up the intrinsic layers 18(1)-18(4). The quantum dots or dashes are formed to have the substantially the same size in each of the intrinsic layers 18(1)-18(4), although other configurations could be used, such as decreasing the size of the quantum dots or dashes in each of the intrinsic layers 18(1)-18(4) from the surface 30 towards the substrate 12. Accordingly, by adjusting the size of the quantum dots, the photovoltaic device 10 can be tuned to a variety of solar or other spectral distributions.

In this particular embodiment, the quantum dots are fabricated by using photolithographic techniques, although other manners for fabricating the quantum dots or dashes could be used, such as a self-assembly technique called the Stranski-Krastanov (S-K) growth mode. This self-assembly technique takes advantage of the strain energy generated from the lattice mismatch between the host material and the quantum dot material to transition the growth from two dimensional layer-by-layer growth to three dimensional "island" growth.

Next, V-shaped grooves 26(1) and 26(2) are etched into the structures 24(1) and 24(2) to extend from surface 30 towards the substrate 12 using standard photolithography techniques, although other numbers and shapes of grooves could be formed and other techniques for forming the grooves could be used. In this particular embodiment, grooves 26(1) and 26(2) are each etched through n type layer 14(3), intrinsic layer 18(4), p type layer 16(2), intrinsic layer 18(3), n type layer 14(2), intrinsic layer 18(2), p type layer 16(1), intrinsic layer 18(1), and n type layer 14(1), although each of the grooves could etched through other numbers and types of layers to other depths.

Next, n type region 22 adjacent the groove 26(1) is formed in the n type layer 14(3), the intrinsic layer 18(4), the p type layer 16(2), the intrinsic layer 18(3), the n type layer 14(2), the intrinsic layer 18(2), the p type layer 16(1), the intrinsic layer 18(1), the n type layer 14(1), and the substrate 12, although other types and numbers of regions could be formed. Additionally, p type region 23 is formed in the n type layer 14(3), the intrinsic layer 18(4), the p type layer 16(2), the intrinsic layer 18(3), the n type layer 14(2), the intrinsic layer 18(2), the p type layer 16(1), the intrinsic layer 18(1), the n type layer 14(1), and the substrate 12, although other types and numbers of regions could be formed. By way of example only, the n type region 22 and the p type region 23 can be formed with ion implantation, diffusion, or epitaxial regrowth.

Next, the conductive contact 20(1) is deposited on a portion of the surface 30 of the n type layer 14(3) adjacent groove 26(1) and also along the n type region 22 in the groove 26(1), although the conductive contact could be formed in other manners. Additionally, the conductive contact 20(2) is deposited on another portion of the surface 30 of the n type layer 14(3) adjacent groove 26(2) and also along the p type region 23 in the groove 26(1), although this conductive contact also could be formed in other manners. The metallization in the groove 26(1) to form conductive contact 20(1) is ohmic to the n-type layers and rectifying to the p-type layers adjacent the groove 26(1). The metallization in the groove 26(2) to form conductive contact 20(2) is ohmic to the p-type layers and rectifying to the n-type layers adjacent the groove 26(2).

The operation of the photovoltaic device 10 in accordance with embodiments of the present invention will now be described with reference to FIGS. 1 and 2. The photovoltaic device 10 is exposed to solar light to be converted to electrical energy, although the photovoltaic device 10 could be exposed to other types and amounts of radiation energy for conversion to electrical energy. This solar light is absorbed by the structures 24(1) and 24(2) in the photovoltaic device 10 and results in the collection of photo-generated carriers via drift in the spatially separated n type layers 14(1)-14(3) and p type layers 16(1)-16(2). The photo-generated carriers are laterally transported to the n type region 22 adjacent groove 26(1) and the p type region 23 adjacent groove 26(2). Next, this electrical energy in the n type region 22 and the p type region 23 is output via conductive contacts 20(1)-20(2).

Figure 2:
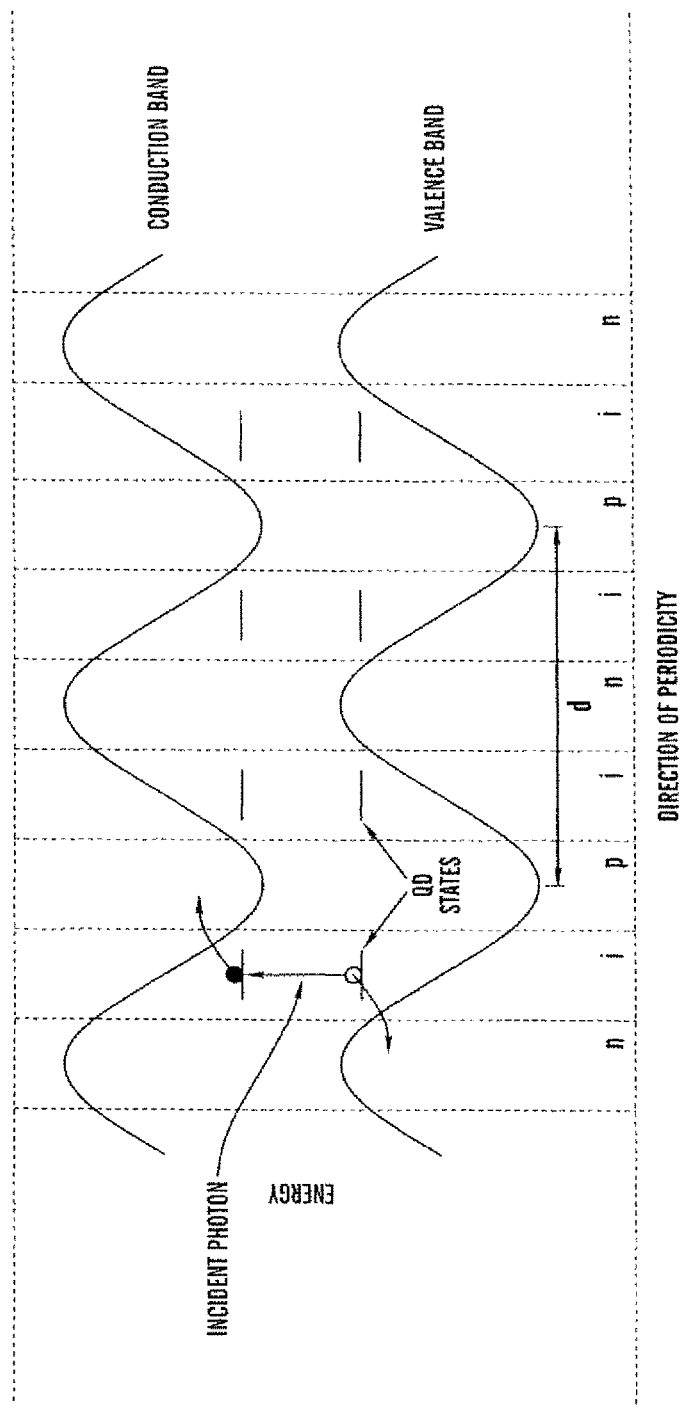
FIG. 2 is a graph of an idealized energy band for the photovoltaic device shown in FIG. 1.

Accordingly, with the present invention charge separation and transport occur within two separate orthogonal planes resulting in a reduction in the overlap of the e-h wave functions and hence longer recombination lifetimes as shown in FIG. 2. The "nipi" structures 24(1) and 24(2) are used because they enables enhancement of radiation tolerance of the host material (i.e., wide bandgap semiconductor). The primary degradation mechanism in a photovoltaic device 10 under irradiation is carrier recombination at radiation-induced defect sites. This is dramatically reduced in the photovoltaic device 10 with "nipi" structures 24(1) and 24(2). The much longer recombination times afforded by the reduced overlap of the e-h wave functions reduces the sensitivity of photovoltaic device 10 to the presence of recombination centers. Thus, the "nipi" structures 24(1) and 24(2) enable high efficiency and enhanced radiation tolerance.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method for making a photovoltaic device, the method comprising:
    forming an n type layer on a substrate, a first structure on the n type layer, and a second structure stacked on the first structure, wherein the first structure comprises forming in sequence an intrinsic layer on the n type layer and a p type layer on the intrinsic layer and an intrinsic layer on the p type layer and an n type layer on the intrinsic layer, wherein the second structure comprises forming in sequence an intrinsic layer on the n type layer and a p type layer on the intrinsic layer and an intrinsic layer on the p type layer and an n type layer on the intrinsic layer;
    incorporating an array of quantum dots and quantum dashes in the intrinsic layers of the structures;
    forming a first groove which extends from a surface of the second structure into the substrate;
    forming parallel to the first groove a second groove which extends from a surface of the second structure into the substrate;
    forming an n type region in the layers of the first structure, second structure, n type layer adjacent the substrate, and the substrate adjacent the first groove and a p type region in the layers of the first structure, second structure, n type layer adjacent the substrate, and the substrate adjacent the second groove; and
    forming a conductive contact on a portion of the surface of the second structure adjacent the first groove and along the n type region in the first groove and a conductive contact on a portion of the surface of the second structure adjacent the second groove and along the p type region in the second groove, such that the conductive contact in the first groove is ohmic to the n type layers and rectifying to the p type layers adjacent the first groove and the conductive contact in the second groove is ohmic to the p type layers and rectifying to the n type layers adjacent the second groove.

2. The method as set forth in claim 1 further comprising forming two or more of the structures which are stacked on each other.

3. The method as set forth in claim 1 wherein the the array of the quantum dots and the quantum dashes in the intrinsic layer in each of the structures are substantially the same size.

4. The method as set forth in claim 1 wherein the array of the quantum dots and the quantum dashes in the intrinsic layers in the structures have a different size than the array of the at least one of the quantum dots and the quantum dashes in the intrinsic layer in another one of the structures.

5. The method as set forth in claim 1 wherein the size of the array of the quantum dots and the quantum dashes in each of the intrinsic layers in the structures decreases with depth into the structure.

6. The method as set forth in claim 1 wherein the forming further comprises forming one of an n type region and a p type region in at least one of the structures which is adjacent and extends an entire length of the groove.

* * * * *

UNITED STATES PATENT AND TRADEMARK OFFICE
CERTIFICATE OF CORRECTION

PATENT NO. : 8,952,242 B2  
APPLICATION NO. : 12/630334  
DATED : February 10, 2015  
INVENTOR(S) : Ryne P. Raffaele and David Wilt Page 1 of 1

It is certified that error appears in the above-identified patent and that said Letters Patent is hereby corrected as shown below:

In the Claims

Column 6, line 22, Claim 1, after the word "of", add the text "at least one of"

Column 6, line 49, Claim 2, after the word "wherein", delete the word "the" (double occurrence)

Column 6, line 50, Claim 2, after the word "of", add the text "at least one of"

Column 6, line 53, Claim 4, before the first word of the line "the", add the text "at least one of"

Column 6, line 58, Claim 5, after the words "array of", add the text "at least one of"

Signed and Sealed this  
Twenty-sixth Day of May, 2015

Michelle K. Lee  
*Director of the United States Patent and Trademark Office*